United States Patent
Yuasa

(10) Patent No.: US 8,242,843 B2
(45) Date of Patent: Aug. 14, 2012

(54) PUSH-PULL AMPLIFIER CIRCUIT AND OPERATIONAL AMPLIFIER CIRCUIT USING THE SAME

(75) Inventor: Tachio Yuasa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/805,265

(22) Filed: Jul. 21, 2010

(65) Prior Publication Data

US 2011/0050342 A1     Mar. 3, 2011

(30) Foreign Application Priority Data

Aug. 28, 2009   (JP) ................................. 2009-198000

(51) Int. Cl.
*H03F 3/26* (2006.01)
(52) U.S. Cl. ....................................... 330/264; 330/269
(58) Field of Classification Search .................. 330/255, 330/262, 263, 264, 269, 267
See application file for complete search history.

(56) References Cited

U.S. PATENT DOCUMENTS

| | | | | |
|---|---|---|---|---|
| 4,529,948 A | * | 7/1985 | Bingham | 330/264 |
| 5,334,950 A | * | 8/1994 | Arimoto | 330/264 |
| 5,825,228 A | * | 10/1998 | Gross | 330/267 |
| 6,696,895 B2 | * | 2/2004 | Tsukuda | 330/264 |

FOREIGN PATENT DOCUMENTS

JP     2002-261550 A     9/2002

* cited by examiner

*Primary Examiner* — Khanh V Nguyen
(74) *Attorney, Agent, or Firm* — McGinn IP Law Group, PLLC

(57) ABSTRACT

A push-pull amplifier including first to third current paths. The first current path includes first transistor allowing first current to flow through the first current path according to input signal. The second current path includes second transistor allowing second current having opposite phase to the first current to flow through the second current path according to the first current; first resistor; and third transistor connected to one end of the first resistor and having control terminal connected to the other end of the first resistor. The third current path includes output terminal; fourth transistor allowing current having the same phase as the first current to flow through the third current path according to the input signal; and fifth transistor allowing current having the same phase as the second current to flow through the third current path according to voltage of first node between the first resistor and the third transistor.

19 Claims, 7 Drawing Sheets

PUSH-PULL AMPLIFIER CIRCUIT AND OPERATIONAL AMPLIFIER CIRCUIT USING THE SAME

INCORPORATION BY REFERENCE

This application is based upon and claims the benefit of priority from Japanese patent application No. 2009-198000, filed on Aug. 28, 2009, the disclosure of which is incorporated herein in its entirety by reference.

BACKGROUND

1. Field of the Invention

The present invention relates to a push-pull amplifier circuit and an operational amplifier circuit using the same.

2. Description of Related Art

FIG. 7 shows a push-pull amplifier circuit 1 disclosed in Japanese Unexamined Patent Application Publication No. 2002-261550 as prior art. As shown in FIG. 7, the push-pull amplifier circuit 1 includes constant current sources I1 to I3, NMOS transistors M1 to M5 and M8, a depletion-type NMOS transistor M6, PMOS transistors M7 and M9, resistors R1 to R3, a signal input terminal TIN, and a signal output terminal TOUT. The NMOS transistors M1 to M5 and M8 and the PMOS transistors M7 and M9 are enhancement-type MOS transistors. Note that reference symbols "I1" to "I3" denote constant current sources as well as currents output from the constant current sources and current values thereof.

The operation of the push-pull amplifier circuit 1 will be described. First, consider a case that voltage Vin of the input signal supplied to the signal input terminal TIN (hereinafter, referred to as "input voltage") decreases. When the input voltage Vin decreases, drain currents IM7 and IM9 of the PMOS transistors M7 and M9 increase. The NMOS transistors M5 and M4 constitute a current mirror. Thus, when the drain current IM7 increases, a drain current IM4 of the NMOS transistor M4 also increases. When the drain current IM4 increases, a gate-source voltage V1 of the NMOS transistor M8 decreases. As a result, the drain current of the NMOS transistor M8 decreases. Accordingly, an output voltage Vout of the signal output terminal TOUT increases.

Next, consider a case that the input voltage Vin supplied to the signal input terminal TIN increases. When the input voltage Vin increases, the drain currents IM7 and IM9 of the PMOS transistors M7 and M9 decrease. When the drain current IM7 decreases, the drain current IM4 of the NMOS transistor M4 also decreases. When the drain current IM4 decreases, the gate-source voltage V1 of the NMOS transistor M8 increases. As a result, the drain current of the NMOS transistor M8 increases. Accordingly, the output voltage Vout of the signal output terminal TOUT decreases.

In this way, the push-pull amplifier circuit 1 makes the drain currents of the PMOS transistor M9 and the NMOS transistor M8 vary according to the input voltage Vin. The PMOS transistor M9 and the NMOS transistor M8 constitute a current path for an output stage of the push-pull amplifier circuit 1. Accordingly, the push-pull amplifier circuit 1 operates push-pull output function on output current Tout. Regard that a portion composed of the constant current sources I1 to I3, the NMOS transistors M1 to M3, and the resistors R1 and R2 is designed so that the appropriate gate-source voltage V1 is applied to the NMOS transistor M8 when the value of the output current Iout (source direction is defined as positive) flowed from the signal output terminal TOUT is zero. The value of the output current Iout flowed from the signal output terminal TOUT is zero means that the drain current values of IM8 and IM9 are equal (IM9=IM8).

Now, consider a case that the input voltage Vin is further decreased so as to further increase the output current Iout or further increase the output voltage Vout in the operation of the push-pull amplifier circuit 1. When the input voltage Vin decreases, the drain current IM9 increases and the drain current IM7 also increases. As the drain current IM7 increases, the drain current IM8 decreases. Then, the voltage Vout increases. When the output voltage Vout is close to a power supply voltage VDD, the drain-source voltage of the PMOS transistor M9 decreases. This makes the PMOS transistor M9 operate in a linear region and contribute less to increase of the drain current IM9 even if the input voltage Vin is greatly decreased. Therefore, further decrease in the input voltage Vin does not effect further increase in the output current Tout or the output voltage Vout. In such a case, the NMOS transistor M6 and the resistor R3 suppress the upper limit value of the drain current IM7 of the PMOS transistor M7, thereby reducing power consumption of the push-pull amplifier circuit 1. This effect is based on the operation principle of the push-pull amplifier circuit 1 as described below.

To explain the above-mentioned effect, assume a configuration of the push-pull amplifier circuit 1 in which the NMOS transistor M6 and the resistor R3 are omitted. First, since the NMOS transistor M5 operates as a MOS diode, the drain voltage V2 of the NMOS transistor M5 would be approximately slightly higher than the threshold voltage, for example, about 1.0 V. Assuming that the power supply voltage VDD is 3.0 V, the drain-source voltage of the PMOS transistor M7 is about 2.0 V. Such a voltage is generally sufficient for the PMOS transistor M7 to operate in the saturated region. Accordingly, if the input voltage Vin is decreased, the drain current IM7 further increases and this leads increase in wasteful current consumption while an increase in the output current Iout is not gained.

In the push-pull amplifier circuit 1, the NMOS transistor M6 is a depletion-type transistor which is self-biased by the drain current with the resistor R3 the NMOS transistor M6 is suppressed flowing drain current under normally-on where the gate-source voltage is zero or less. Therefore, the upper limit value of the drain current IM7 is controlled and an increase in wasteful current consumption is prevented.

SUMMARY

The present inventor has found a problem as described below. In the push-pull amplifier circuit 1, even when the value of the output current Tout is zero, the portion composed of the constant current sources I1 to I3, the NMOS transistors M1 to M3, and the resistors R1 and R2 is required merely to maintain the circuit in the normal operating state, i.e., in a so-called stand-by state. The above-mentioned configuration is not directly involved in the output operation of the circuit. Additionally, the currents I1, I2, and IM2 that flow through the configuration are also required.

In recent years, a reduction in the number of elements constituting a circuit has been demanded. If the number of elements is reduced, the number of components that constitute a circuit and the chip area of an LSI can be reduced. This leads to a reduction in manufacturing costs. Further, a reduction in current consumption in the circuit has also been demanded.

Contrary to the demands for products, the push-pull amplifier circuit 1 has a problem that the size of the circuit portion that is not directly involved in the output operation as described above becomes large. The push-pull amplifier circuit 1 has another problem that current consumption becomes large.

A first exemplary aspect of the present invention is a push-pull amplifier circuit including first, second, and third current paths. The first current path includes a first transistor that allows a first current to flow through the first current path according to an input signal. The second current path includes: a second transistor that allows a second current to flow through the second current path according to the first current, the second current having a phase opposite to a phase of the first current; a first resistor; and a third transistor that is connected to one end of the first resistor and has a control terminal connected to the other end of the first resistor. The third current path includes: an output terminal; a fourth transistor that is connected to the output terminal and allows a current to flow through the third current path according to the input signal, the current having the same phase as the first current; and a fifth transistor that is connected to the output terminal and allows a current to flow through the third current path according to a voltage of a first node between the first resistor and the third transistor, the current having the same phase as the second current.

The push-pull amplifier circuit according to the first exemplary aspect of the present invention allows a current having the same phase as the first current flowing through the first current path to flow through the fourth transistor included in the third current path serving as an output stage. Further, the push-pull amplifier circuit allows a current having a phase opposite to that of the first current flowing through the second current path to flow through the fifth transistor included in the third current path. The second current path has a function of suppressing excessive current consumption caused due to the input signal. Consequently, the amplifier circuit according to an exemplary aspect of the present invention has a function of suppressing excessive current consumption, and can be formed using the minimum number of elements that constitute the current paths. Moreover, the number of current paths through which a current flows is reduced, which is advantageous in reducing current consumption.

According to an exemplary aspect of the present invention, a push-pull amplifier circuit capable of reducing the circuit size and current consumption can be provided.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
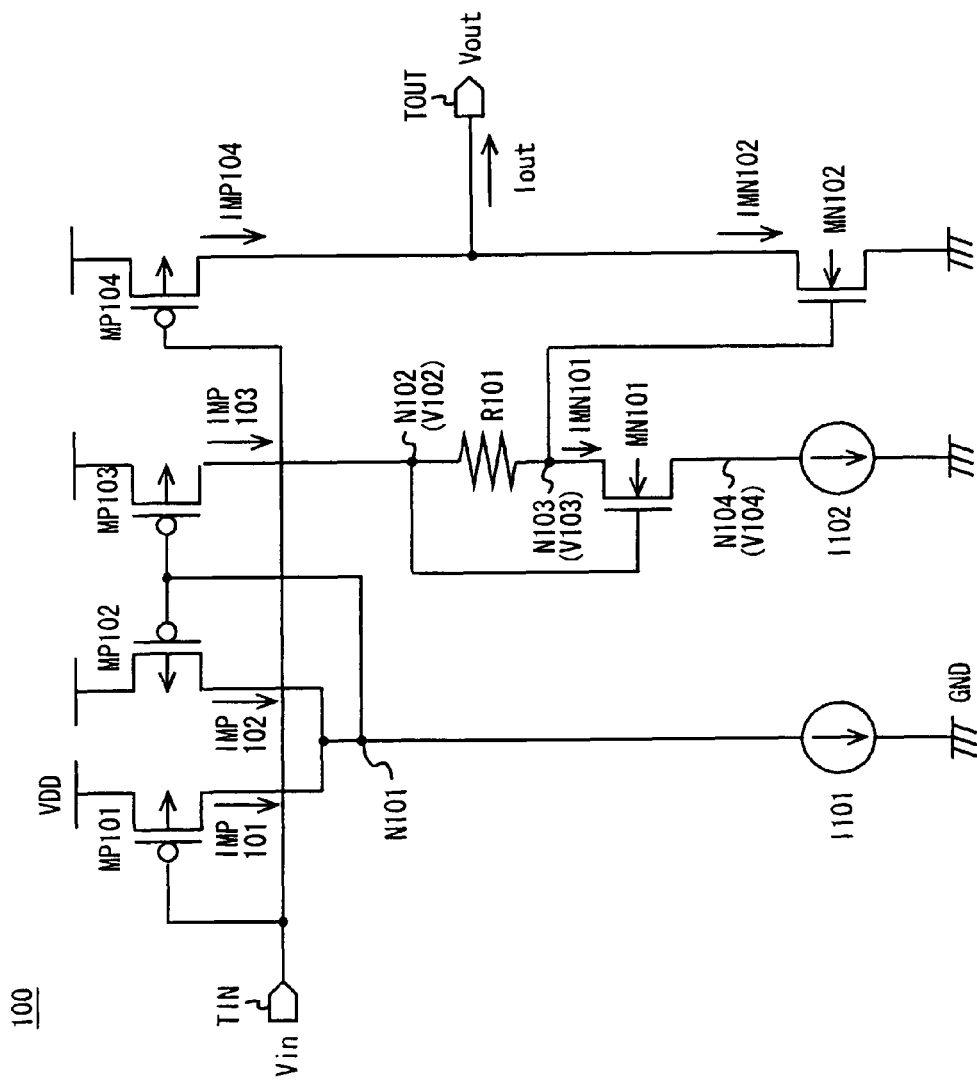
FIG. 1 shows a push-pull amplifier circuit according to a first exemplary embodiment of the present invention.

A first exemplary embodiment of the present invention will be described in detail below with reference to the drawings. FIG. 1 shows a configuration of a push-pull amplifier circuit 100 according to the first exemplary embodiment. As shown in FIG. 1, the push-pull amplifier circuit 100 includes constant current sources I101 and I102, PMOS transistors MP101 to MP104, NMOS transistors MN101 and MN102, a resistor R101, a signal input terminal TIN, and a signal output terminal TOUT. Note that reference symbols "I101" and "I102" denote constant current sources as well as currents output from the constant current sources and current values thereof. Reference symbols "VDD" and "GND" denote a power supply voltage terminal and a ground voltage terminal, respectively, and also denote a power supply voltage supplied from the power supply voltage terminal and a ground voltage supplied from the ground voltage terminal, respectively.

The PMOS transistor MP101 has a source connected to the power supply voltage terminal VDD, a drain connected to a node N101, and a gate connected to the signal input terminal TIN. The PMOS transistor MP102 has a source connected to the power supply voltage terminal VDD, a drain connected to the node N101, and a gate connected to the node N101.

The PMOS transistor MP103 has a source connected to the power supply voltage terminal VDD, a drain connected to a node N102, and a gate connected to the node N101. The PMOS transistor MP104 has a source connected to the power supply voltage terminal VDD, a drain connected to the signal output terminal TOUT, and a gate connected to the signal input terminal TIN.

The resistor R101 has one end connected to the node N102, and the other end connected to a node N103. The NMOS transistor MN101 has a drain connected to the node N103, a source connected to a node N104, and a gate connected to the node N102. The NMOS transistor MN102 has a drain connected to the signal output terminal TOUT, a source connected to the ground voltage terminal GND, and a gate connected to the node N103.

The constant current source I101 is connected between the node N101 and the ground voltage terminal GND. The constant current source I102 is connected between the node N104 and the ground voltage terminal GND.

To facilitate understanding of the principle of the circuit, assume that the constant current sources I101 and I102 are ideal constant current sources. As described later, the constant current sources I101 and I102 may actually be composed of transistors which have gates supplied with a predetermined bias voltage and which are driven by constant currents, or may be composed of transistors which constitute a current mirror and which are driven by constant currents. Further, the signal input terminal TIN may directly receive an input signal from the outside, and a differential amplifier circuit may be connected at a pre-stage of the circuit. In this case, the output of the differential amplifier circuit may be connected to the signal input terminal TIN to thereby constitute an operational amplifier circuit (Op Amp) as a whole.

The operation of the push-pull amplifier circuit 100 will be qualitatively described. First, consider a case that a voltage Vin of an input signal supplied to the signal input terminal TIN (hereinafter, referred to as "input voltage") decreases.

When the input voltage Vin decreases, drain currents IMP101 and IMP104 of the PMOS transistors MP101 and MP104 increase.

The PMOS transistor MP102 operates as a MOS diode. A drain current IMP102 of the PMOS transistor MP102 has a value obtained by subtracting the value of the drain current IMP101 from the value of the constant current I101. Thus, when the drain current IMP101 increases, the drain current IMP102 decreases.

The PMOS transistors MP102 and MP103 constitute a current mirror. Accordingly, when the drain current IMP102 decreases, also a drain current IMP103 of the PMOS transistor MP103 tends to decrease.

However, the PMOS transistor MP103 and the constant current source I102 are connected in series in the same current path. Thus, when the drain current IMP103 tends to decrease, voltages at the nodes N102 to N104, which are located between the PMOS transistor MP103 and the constant current source I102, decrease. The voltages are decreased to a level at which an increase of the drain current IMP103 due to an increase of the drain-source voltage of the PMOS transistor MP103 is balanced by a decrease of the current I102 due to a decrease of the drain-source voltage of the transistor operating as the constant current source I102.

As a result, voltages V102 to V104 at the respective nodes N102 to N104 decrease. Then, a drain current IMN102 of the NMOS transistor MN102 having a gate connected to the node N103 decreases, and an output voltage Vout of the signal output terminal TOUT increases.

Next, consider a case that the input voltage Vin supplied to the signal input terminal TIN increases. When the input voltage Vin increases, the drain currents IMP101 and IMP104 of the PMOS transistors MP101 and MP104 decrease.

The drain current IMP102 of the PMOS transistor MP102 operating as the MOS diode has a value obtained by subtracting the value of the drain current IMP101 from the value of the constant current I101. Accordingly, when the drain current IMP101 decreases, the drain current IMP102 increases.

The PMOS transistors MP102 and MP103 constitute a current mirror. Thus, when the drain current IMP102 increases, also the drain current IMP103 of the PMOS transistor MP103 tends to increase.

However, the PMOS transistor MP103 and the constant current source I102 are connected in series in the same current path. Accordingly, when the drain current IMP103 tends to increase, the voltages at the nodes N102 to N104, which are located between the PMOS transistor MP103 and the constant current source I102, increase. The voltages are increased to a level at which a decrease of the drain current IMP103 due to a decrease of the drain-source voltage of the PMOS transistor MP103 is balanced by an increase of the current I102 due to an increase of the drain-source voltage of the transistor operating as the constant current source I102.

As a result, the voltages V102 to V104 of the respective nodes N102 to N104 increase. Then, the drain current IMN102 of the NMOS transistor MN102 having a gate connected to the node N103 increases, and the output voltage Vout of the signal output terminal TOUT decreases. In this way, the push-pull amplifier circuit 100 operates push-pull output function on the drain currents of the PMOS transistor MP104 and the NMOS transistor MN102 which are provided at the output stage.

Next, the operation of the push-pull amplifier circuit 100 will be quantitatively described. In the push-pull amplifier circuit 100, gate W/L ratios of MOS transistors that are required to operate relatively are defined by the expression (1). Assume that the W/L ratios of the PMOS transistors MP101 to MP104 are respectively represented by "(W/L)MP101" to "(W/L)MP104". Also assume that the W/L ratios of the NMOS transistors MN101 and MN102 are respectively represented by "(W/L)MN101" and "(W/L)MN102".

$$\left.\begin{array}{l}(W/L)MP101:(W/L)MP104 = 1:p \\ (W/L)MP102:(W/L)MP103 = 1:q \\ (W/L)MN101:(W/L)MN102 = 1:r\end{array}\right\} \quad (1)$$

Hereinafter, to simplify the explanation, assume that a short channel effect, a substrate bias effect, and an early voltage effect in the PMOS transistors MP101 to MP104 and the NMOS transistors MN101 and MN102 are disregarded and the relative error of each element in the circuit is zero. Furthermore, assume that the transistors constituting the constant current sources I101 and I102, the PMOS transistors MP101 to MP104, and the NMOS transistors MN101 and MN102 operate in a saturated region. It is generally easy to design a circuit such that every transistor operates in the saturated region, unless the power supply voltage is extremely low. Therefore, the circuit design can be made without loss of generality. Let a threshold voltage of the NMOS transistors MN101 and MN102 be Vthn, and a mutual conductance coefficient be βn (βn=μn·Coxn, where μn represents an electron mobility and Coxn represents a gate capacitance per area).

Under the above-mentioned conditions, drain currents IMN101 and IMN102 can be expressed as the following expressions (2) and (3), respectively.

$$IMN101 = \frac{\beta}{2} \times (W/L)MN101 \times (V102 - V104 - Vthn)^2 \quad (2)$$

$$IMN102 = \frac{\beta}{2} \times (W/L)MN102 \times (V103 - Vthn)^2 \quad (3)$$

From the expressions (2) and (3), IMN102/IMN101 can be expressed as the following expression (4).

$$\frac{IMN102}{IMN101} = \frac{\frac{\beta}{2} \times (W/L)MN102 \times (V103 - Vthn)^2}{\frac{\beta}{2} \times (W/L)MN101 \times (V102 - V104 - Vthn)^2} \quad (4)$$

$$= r \times \frac{(V103 - Vthn)^2}{(V102 - V104 - Vthn)^2}$$

Here, if the relationship between the voltages V102 and V103 satisfies the following expression (5), IMN102/IMN101 can be expressed as the following expression (6).

$$V102 - V104 = V103 \quad (5)$$

$$\frac{IMN102}{IMN101} = r \times \frac{(V103 - Vthn)^2}{(V102 - V104 - Vthn)^2} = r \quad (6)$$

In order to satisfy the condition of the expression (5), the following expression (7) should be satisfied.

$$V104 = V102 - V103 = R101 \times I102 \quad (7)$$

Further, from the expression (1), the drain currents IMP104 and IMN102 are given by the expressions (8) and (9), respectively.

$$IMP104 = p \times IMP101 \quad (8)$$

$$IMP103 = q \times (I101 - IMP101) \quad (9)$$

Next, assume that the drain current IMP101 of the PMOS transistor MP101 is "I0" when an output current Iout from the signal output terminal TOUT is zero, i.e., when the circuit is in a stand-by state. In this case, from the expressions (6) and (9), the drain current IMN102 can be expressed as the following expression (10).

$$IMN102 = r \times IMN101 = r \times IMP103 = r \times q \times (I101 - IMP101) \quad (10)$$

If IMP101=I0, it is obvious that IMN102=IMP104. Thus, the expression (11) is derived from the expressions (8) and (10), and the expression (12) is further obtained.

$$IMN102 = r \times q \times (I101 - I0) = p \times I0 = IMP104 \quad (11)$$

$$I101 = \left(\frac{p}{r \times q} + 1\right) \times I0 \quad (12)$$

When the expression (12) is substituted into the expression (9), the expression (13) is obtained.

$$I102 = q \times (I101 - I0) = q \times \left\{\left(\frac{p}{r \times q} + 1\right) \times I0 - I0\right\} = \frac{p}{r} \times I0 \quad (13)$$

As is apparent from the above, the expression (7) is a condition that defines the voltage V104 and the resistance value of the resistor R101, the expression (12) is a condition that defines the value of a current output from the constant current source I101, and the expression (13) is a condition that defines the value of a current output from the constant current source I102, during the circuit design. Note that the value of the voltage V104, the resistance value of the resistor R101, and the current value of the constant current source I102 are appropriately determined so as to satisfy the expression (7). In order to stabilize the drain current IMN102 of the NMOS transistor MN102 and to multiply the drain current IMN101 of the NMOS transistor MN101 by r, it is necessary to satisfy the expression (7), i.e., to set the voltage drop of the resistor R101 to be substantially equal to the voltage difference between both ends of the constant current source I102.

Also in the case of the push-pull amplifier circuit 100, as with the push-pull amplifier circuit 1, consider a case that the input voltage Vin is greatly decreased so as to further increase the output current Iout or further increase the output voltage Vout. When the input voltage Vin decreases, the drain current IMP104 increases and the drain current IMP101 also increases. However, the constant current source I101 is connected to the current path from the PMOS transistor MP101 to the ground voltage terminal GND. For this reason, the value of the drain current IMP101 cannot be equal to or greater than the value of the current I101 output from the constant current source I101. Then, the upper limit value of the drain current IMP101 is suppressed to prevent an increase in wasteful current consumption. Such a circuit configuration allows lower power consumption of the push-pull amplifier circuit 100 according to the first exemplary embodiment.

In the push-pull amplifier circuit 1 according to the prior art, the upper limit value of the drain current IM7 is suppressed by the NMOS transistor M6 and the resistor R3, to thereby prevent an increase in wasteful current consumption. The NMOS transistor M6 and the resistor R3 are components that are not directly involved in the output operation of the circuit. The components cause an undesirable increase in the size of the push-pull amplifier circuit 1.

Further, in the push-pull amplifier circuit 1, even when the value of the output current Iout is zero, the components including the constant current sources I1 to I3, the NMOS transistors M1 to M3, and the resistors R1 and R2 are required merely to maintain the push-pull amplifier circuit 1 in the normal operating state, i.e., in a state called a stand-by state. The above-mentioned components are not directly involved in the output operation of the circuit, resulting in an undesirable increase in the size of the push-pull amplifier circuit 1. Furthermore, among the currents flowing through the components including the constant current sources I1 to I3, the NMOS transistors M1 to M3, and the resistors R1 and R2, the currents I1, I2, and IM2 which flow through the portion that is not directly involved in the output operation of the circuit are also required. This results in an undesirable increase in power consumption.

Similar to the push-pull amplifier circuit 1, the push-pull amplifier circuit 100 according to the first exemplary embodiment has a function of preventing an increase in wasteful current consumption by limiting the upper limit value of the drain current IMP101 corresponding to, for example, the drain current IM7 in the push-pull amplifier circuit 1 of the prior art. On the other hand, the push-pull amplifier circuit 100 need not include any element dedicated to the operation for preventing an increase in wasteful current consumption. Therefore, the number of elements corresponding to the NMOS transistors M6 and the resistor R3 of the push-pull amplifier circuit 1 of the prior art can be reduced.

Further, in the push-pull amplifier circuit 100 of the first exemplary embodiment, only the constant current sources I101 and I102, the NMOS transistor MN101, and the resistor R101 are required merely to maintain the circuit in the normal state, i.e., in the stand-by state when the value of the output current Iout is zero. Thus, compared to the push-pull amplifier circuit 1 of the prior art, the push-pull amplifier circuit 100 can reduce the number of elements that constitute the circuit. Furthermore, among the currents flowing through the portion composed of the constant current sources I101 and I102, the NMOS transistor MN101, and the resistor R101, only the currents IMP102 and I102 flow through the portion that is not directly involved in the output operation of the circuit. This results in a further reduction in current consumption, compared to the push-pull amplifier circuit 1 of the prior art.

As described above, the push-pull amplifier circuit 100 of the first exemplary embodiment requires no particular design value for the elements to implement the circuit. Therefore, such necessity is not presented or hidden as each element will actually be increased in size and the whole circuit size will also be increased compared to the push-pull amplifier circuit 1, even though the number of elements is small.

Furthermore, in contrast to the push-pull amplifier circuit 1, only the drain current IM102 and the current I102 of the constant current source I102 flow through the portion that is not directly involved in the output operation of the circuit. Thus, the amount of currents flowing through the portion is reduced compared to the push-pull amplifier circuit 1, thereby achieving low power consumption. Such necessity is not presented or hidden as the values of the currents will actually be increased compared to the push-pull amplifier circuit 1, even though the number of current paths for determining current consumption is small. As described above, the push-pull amplifier circuit 100 of the first exemplary embodiment can solve the problem that the size of the push-pull circuit 1 of the prior art becomes large and current consumption also becomes large.

Second Exemplary Embodiment

Figure 2:
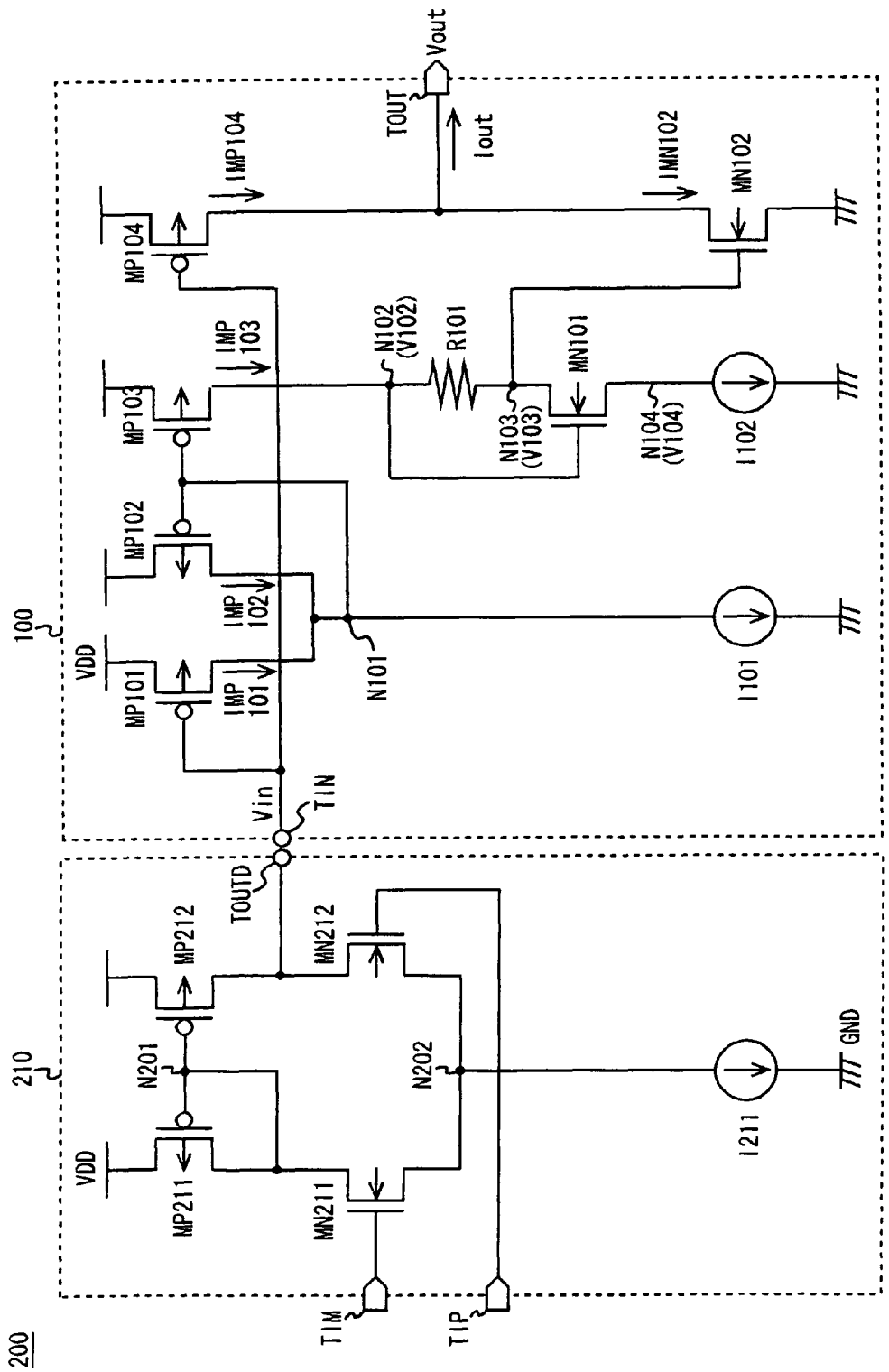
FIG. 2 shows a push-pull amplifier circuit (operational amplifier circuit) according to a second exemplary embodiment of the present invention.

A second exemplary embodiment of the present invention will be described in detail below with reference to the drawings. FIG. 2 shows a configuration of a push-pull amplifier circuit 200 according to the second exemplary embodiment. As shown in FIG. 2, the push-pull amplifier circuit 200 includes a differential amplifier circuit 210 and the push-pull amplifier circuit 100. Reference symbols in FIG. 2 that are identical to those in FIG. 1 denote identical or similar components.

As seen from FIG. 2, the push-pull amplifier circuit 200 has a configuration in which the differential amplifier circuit 210 is connected as a pre-stage circuit of the push-pull amplifier circuit 100. Thus, the second exemplary embodiment differs from the first exemplary embodiment in that the differential amplifier circuit 210 is added as the pre-stage circuit. Therefore, in the second exemplary embodiment, only the difference is mainly described and description of the other identical components is omitted.

The differential amplifier circuit 210 includes PMOS transistors MP211 and MP212, NMOS transistors MN211 and MN212, a constant current source I211, a non-inverting input terminal TIP, an inverting input terminal TIM, and an output terminal TOUTD.

The PMOS transistor MP211 has a source connected to the power supply voltage terminal VDD, and a drain and a gate both connected to a node N201. The PMOS transistor MP212 has a source connected to the power supply voltage terminal VDD, a drain connected to the output terminal TOUTD, and a gate connected to the node N201.

The NMOS transistor MN211 has a drain connected to the node N201, a source connected to a node N202, and a gate connected to the inverting input terminal TIM. The NMOS transistor MN212 has a drain connected to the output terminal TOUTD, a source connected to the node N202, and a gate connected to the non-inverting input terminal TIP. The output terminal TOUTD of the differential amplifier circuit 210 is connected to the signal input terminal TIN of the push-pull amplifier circuit 100.

The differential amplifier circuit 210 is similar to an ordinary differential-input and single-output type differential amplifier circuit, so the description of the operation and the like thereof is omitted. Since the operation of the push-pull amplifier circuit 100 has been described in the first exemplary embodiment, a duplicate description thereof is omitted.

As described above, the push-pull amplifier circuit 200 has a configuration in which the differential amplifier circuit 210 is connected as the pre-stage circuit of the push-pull amplifier circuit 100. The push-pull amplifier circuit 200 having such a configuration can be constituted as an operational amplifier circuit (Op Amp) as a whole. The operational amplifier circuit (Op Amp) is suitable for use as a push-pull amplifier circuit. This is because the operational amplifier produces negative feedback in the whole application circuit to which the operational amplifier is applied, thereby improving the operation accuracy.

Third Exemplary Embodiment

Figure 3:
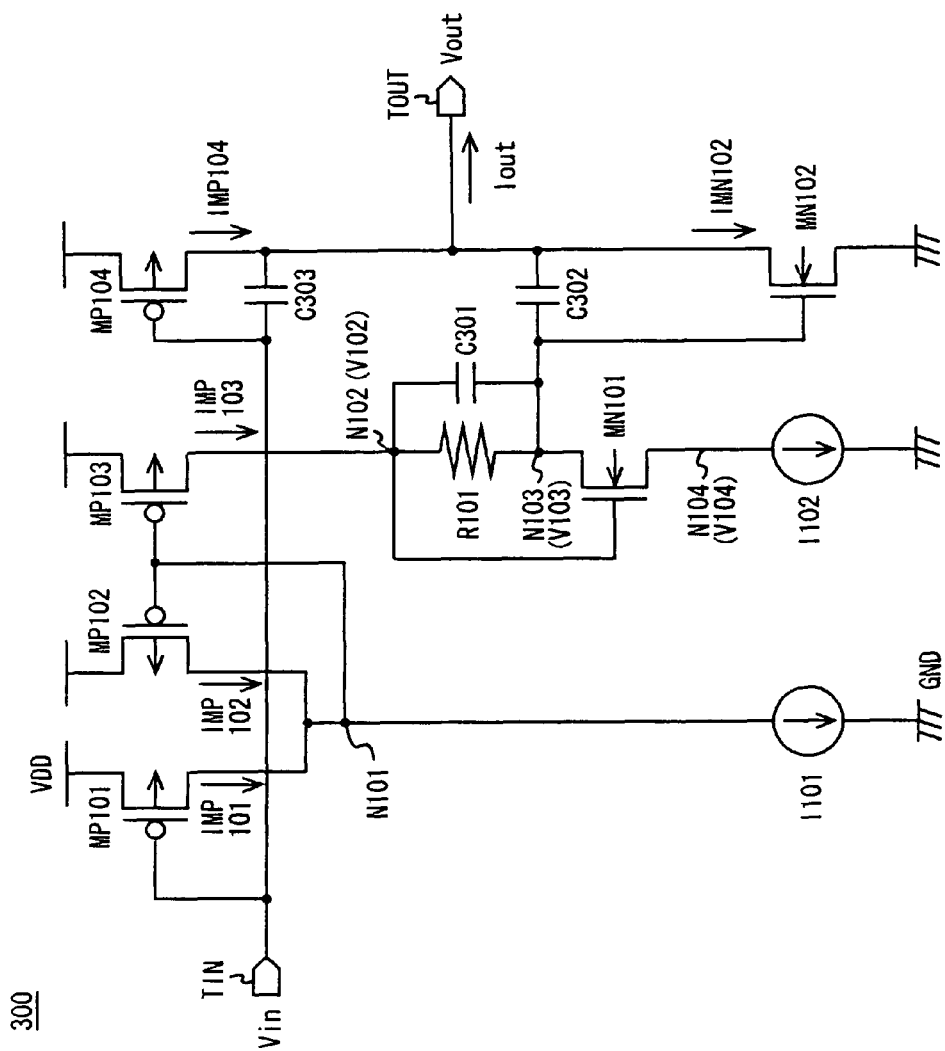
FIG. 3 shows a push-pull amplifier circuit according to a third exemplary embodiment of the present invention.

A third exemplary embodiment of the present invention will be described in detail below with reference to the drawings. FIG. 3 shows a configuration of a push-pull amplifier circuit 300 according to the third exemplary embodiment. As shown in FIG. 3, the push-pull amplifier circuit 300 includes the constant current sources I101 and I102, the PMOS transistors MP101 to MP104, the NMOS transistors MN101 and MN102, the resistor R101, capacitor elements C301 to C303, the signal input terminal TIN, and the signal output terminal TOUT. Note that reference symbols in FIG. 3 that are identical to those in FIG. 1 denote identical or similar components. The third exemplary embodiment differs from the first exemplary embodiment in that the capacitor elements C301 to C303 are added. Therefore, in the third exemplary embodiment, only the difference is mainly described and the description of the other identical components is omitted.

The capacitor element C301 has one end connected to the node N102, and the other end connected to the node N103. The capacitor element C302 has one end connected to the node N103, and the other end connected to the signal output terminal TOUT. The capacitor element C303 has one end connected to the signal input terminal TIN, and the other end connected to the signal output terminal TOUT.

The operation of the push-pull amplifier circuit 300 is similar to that of the push-pull amplifier circuit 100 of the first exemplary embodiment, so the description thereof is omitted. The capacitor elements C301 to C303 of the push-pull amplifier circuit 300 function as capacitor elements that compensate for a signal phase. An advantageous effect of the push-pull amplifier circuit 300 is described below.

As described in the second exemplary embodiment, an amplifier circuit is used as an operational amplifier circuit (Op Amp) in many cases. An operational amplifier circuit having a negative feedback configuration is suitable for use as an application circuit. When the operational amplifier circuit is configured in this manner, the differential amplifier circuit 210 described in the second exemplary embodiment is connected as a pre-stage of the push-pull amplifier circuit 300.

Figure 4:
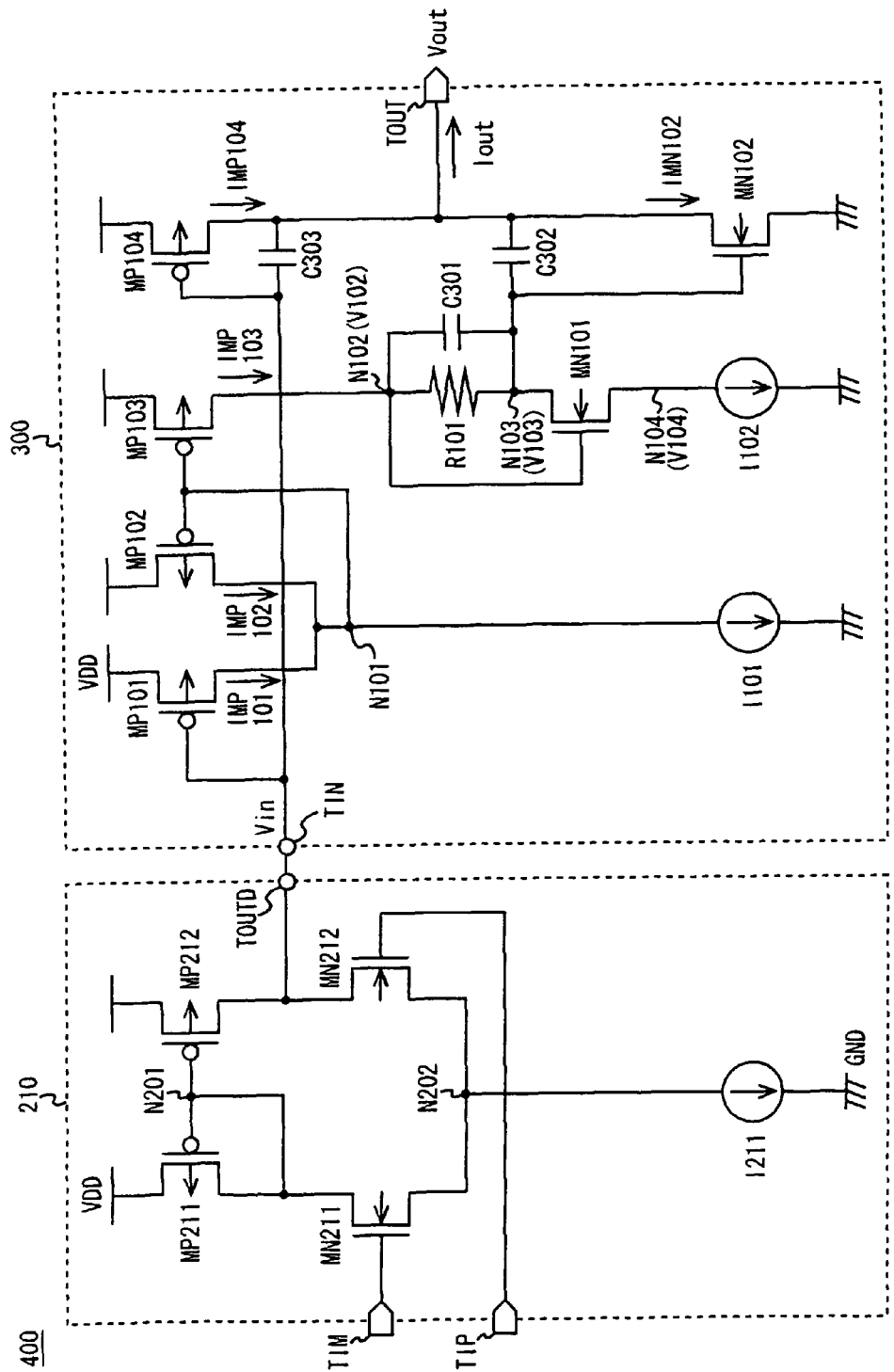
FIG. 4 shows a push-pull amplifier circuit (operational amplifier circuit) according to the third exemplary embodiment.

Further, as shown in FIG. 4, the output terminal TOUTD of the differential amplifier circuit 210 is connected to the signal input terminal TIN of the push-pull amplifier circuit 300. Since the configuration of the differential amplifier circuit 210 has been described in the second exemplary embodiment, a duplicate description thereof is omitted.

The operational amplifier circuit having a configuration in which the differential amplifier circuit 210 is added as described above is used as a push-pull amplifier circuit 400. The push-pull amplifier circuit 400 includes three or more stages of signal paths in total from the gate to the drain of a transistor. If the multiple stages of circuit paths are formed in a negative feedback configuration, a problem arises due to a delay in phase of a signal which is negatively fed back. For example, there arises a problem that the circuit may oscillate when put into a positive feedback state due to the delay in phase of the signal which is negatively fed back. As a countermeasure against this problem, a method of adding a phase compensation circuit using a capacitor element as an output stage portion is generally employed. In the third exemplary embodiment, the push-pull amplifier circuit 300 including the capacitor elements C301 to C303 is used to constitute the push-pull amplifier circuit 400 serving as an operational amplifier circuit. When the push-pull amplifier circuit 400 has a negative feedback configuration, the occurrence of oscillation can be prevented by the effect of the capacitor elements C301 to C303 for phase compensation.

In particular, the capacitor element C301 has a circuit configuration which is not generally employed. In the push-pull amplifier circuit 300, an output current value of the constant current source I102 is set to about 100 nA, for example, in order to reduce current consumption in the circuit. In this case, a typical enhancement-type MOS transistor requires about 200 mV, for example, as the voltage of V104. Accordingly, a large value, such as 200 mV/100 nA=2 MΩ, is required as the resistance value of the resistor R101. When the resistance value of the resistor R101 is large, parasitic capacitances between electrodes of the PMOS transistor MP103 and the NMOS transistor MN101, which are connected with the resistor R101, are combined with the resistance value, resulting in a large time constant. This causes a large phase delay. However, when the capacitor element C301 of the push-pull amplifier circuit 300 serving as a phase compensating capacitor is connected in parallel with the resistor R101, an advantageous effect of more effectively preventing the oscillation of the circuit can be obtained.

Fourth Exemplary Embodiment

Figure 5:
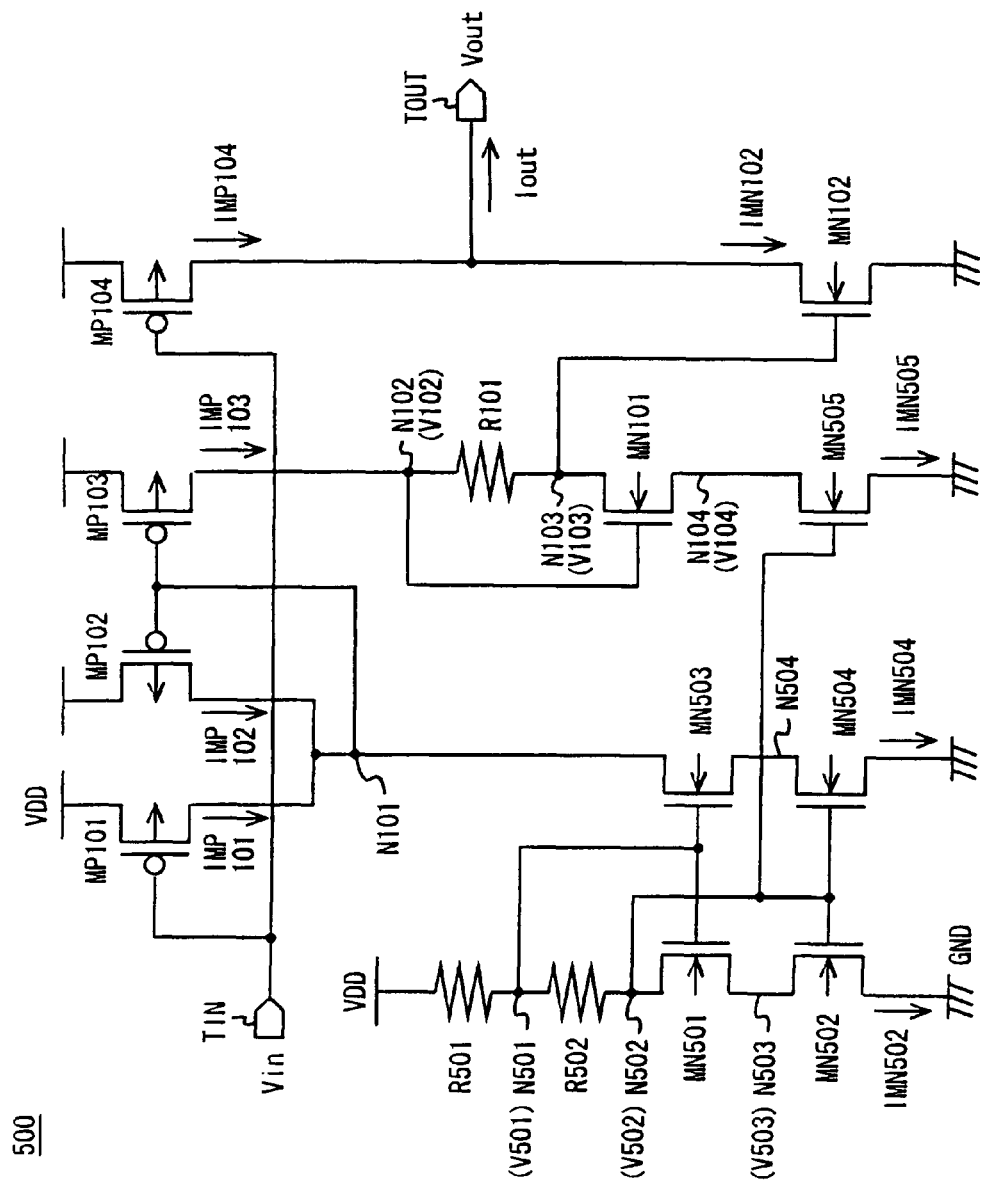
FIG. 5 shows a push-pull amplifier circuit according to a fourth exemplary embodiment of the present invention.

A fourth exemplary embodiment of the present invention will be described in detail below with reference to the drawings. FIG. 5 shows a configuration of a push-pull amplifier circuit 500 according to the fourth exemplary embodiment. As shown in FIG. 5, the push-pull amplifier circuit 500 includes the PMOS transistors MP101 to MP104, the NMOS transistors MN101 and MN102, NMOS transistors MN501 to MN505, the resistor R101, resistors R501 and R502, the signal input terminal TIN, and the signal output terminal TOUT. Note that reference symbols in FIG. 5 that are identical to those in FIG. 1 denote identical or similar components. The fourth exemplary embodiment differs from the first exemplary embodiment in that a portion corresponding to the constant current sources I101 and I102 is replaced by a portion composed of the NMOS transistors MN501 to MN505 and the resistors R501 and R502. Therefore, in the fourth exemplary embodiment, only the difference is mainly described and the description of the other identical components is omitted.

The resistor R501 has one end connected to the power supply voltage terminal VDD, and the other end connected to a node N501. The resistor R502 has one end connected to the node N501, and the other end connected to a node N502. The NMOS transistor MN501 has a drain connected to the node N502, a source connected to a node N503, and a gate connected to the node N501. The NMOS transistor MN502 has a drain connected to the node M503, a source connected to the ground voltage terminal GND, and a gate connected to the node N502.

The NMOS transistor MN503 has a drain connected to the node N101, a source connected to a node N504, and a gate connected to the node N501. The NMOS transistor MN504 has a drain connected to the node N504, a source connected to the ground voltage terminal GND, and a gate connected to the node N502.

The NMOS transistor MN505 has a drain connected to the node N104, a source connected to the ground voltage terminal GND, and a gate connected to the node N502. The voltages of the nodes N501 to N504 are respectively represented by V501 to V504. The drain currents of the NMOS transistors MN502, MN504, and MN505 are respectively represented by IMN502, IMN504, and IMN505.

Thus, in the fourth exemplary embodiment, the constant current sources I101 and I102 of the first exemplary embodiment are implemented by the NMOS transistors MN501 to MN505 and the resistors R501 and R502. The NMOS transistors MN501 and MN502 and the resistors R501 and R502 may constitute a bias voltage generation circuit that generates a bias voltage supplied to the NMOS transistors MN503 to MN505.

Now, a method of obtaining the current value I102 in the expression (7) which is a condition for the circuit design as described in the first exemplary embodiment will be described using the NMOS transistors MN501 to MN505 and the resistors R501 and R502 which are added in the fourth exemplary embodiment. To simplify the explanation, assume that a short channel effect and a substrate bias effect in the NMOS transistors MN501, MN502, and MN505 are disregarded and the relative error of each element in the circuit is zero. Further, assume that every transistor operates in the saturated region. Furthermore, assume that the NMOS transistors MN501 and MN502 have the same gate W/L ratio.

When the NMOS transistors MN501 and MN502 have the same gate W/L ratio, both the transistors have the same gate-source voltage. Thus, the following expressions (14) and (15) are satisfied.

$$V501 - V503 = V502 \tag{14}$$

$$V501 - V502 = R502 \times IMN502 = V503 \tag{15}$$

Assuming that an early voltage is VAn, the drain currents IMN502 and IMN505 are given as the following expressions (16) and (17). Assume that the gate W/L ratios of the NMOS transistors MN501 and MN502 are respectively represented by "(W/L)MN502" and "(W/L)MN505".

$$IMN502 = \frac{\beta}{2} \times (W/L)MN502 \times (V502 - Vthn)^2 \times \left(1 + \frac{V503}{VAn}\right) \tag{16}$$

$$IMN505 = \frac{\beta}{2} \times (W/L)MN505 \times (V502 - Vthn)^2 \times \left(1 + \frac{V104}{VAn}\right) \tag{17}$$

Here, assuming that the NMOS transistors MN502 and MN505 have the same drain-source voltage, the following expressions (18) and (19) are derived from the expressions (7), (16), and (17).

$$\frac{IMN505}{IMN502} = \frac{I102}{IMN502} = \frac{V104/R101}{V503/R502} \tag{18}$$

$$= \frac{\frac{\beta}{2} \times (W/L)MN505 \times (V502 - Vthn)^2 \times \left(1 + \frac{V104}{VAn}\right)}{\frac{\beta}{2} \times (W/L)MN502 \times (V502 - Vthn)^2 \times \left(1 + \frac{V503}{VAn}\right)}$$

$$\frac{R502}{R101} = \frac{(W/L)MN505}{(W/L)MN502} \tag{19}$$

As is apparent from the above, the relationship between the W/L ratios of the NMOS transistors MN501 and MN505 and the resistors R502 and R101 as shown in the expression (19) is a condition for specifically designing the constant current source I102 of the first exemplary embodiment.

As described above, in the push-pull amplifier circuit 500 of the fourth exemplary embodiment, the constant current sources I101 and I102 of the first exemplary embodiment can be implemented by the NMOS transistors MN501 to MN505 and the resistors R501 and R502. Further, as with the second exemplary embodiment, the differential amplifier circuit 210 may be connected as the pre-stage circuit of the push-pull amplifier circuit 500 to constitute an operational amplifier circuit (Op Amp). In this case, the configuration of the constant current source I211 of the differential amplifier circuit 210 can be implemented using a configuration similar to that of the constant current sources I101 and I102.

Fifth Exemplary Embodiment

Figure 6:
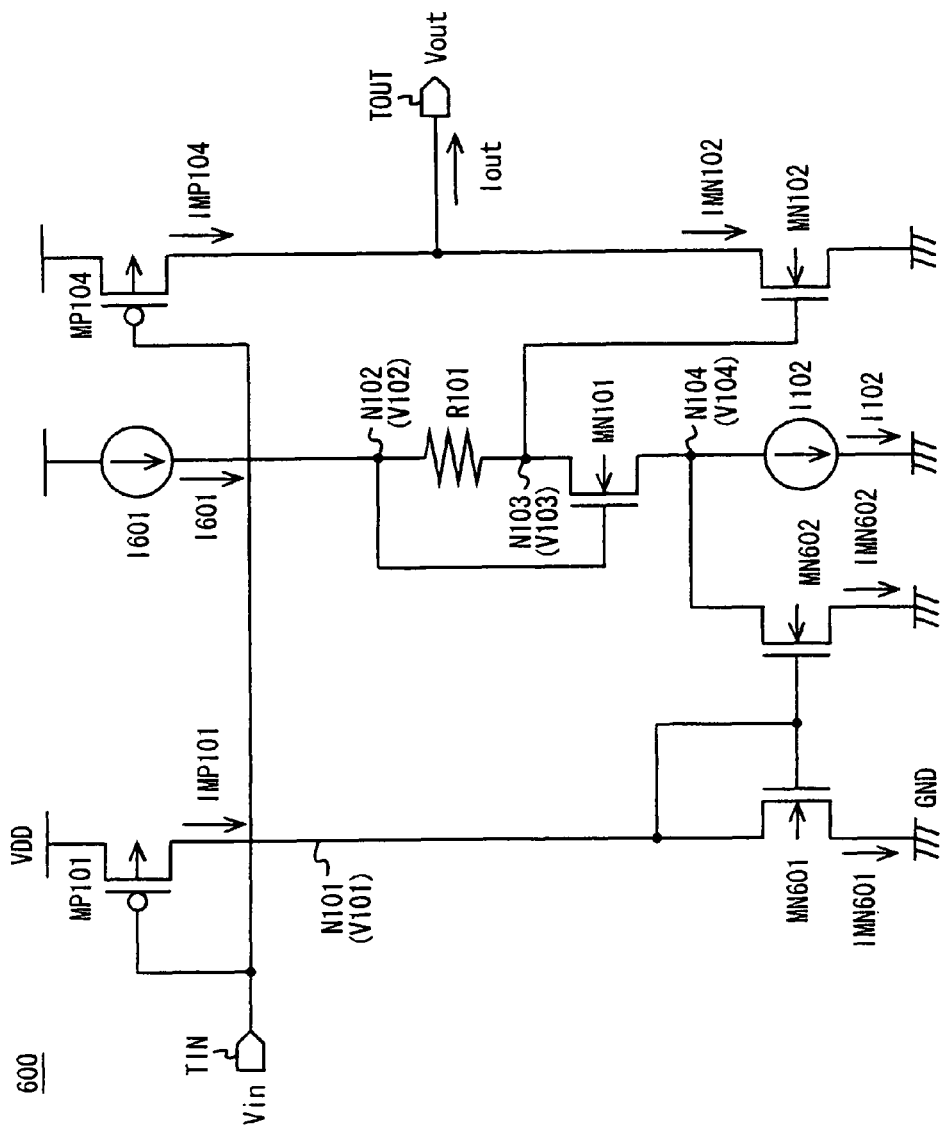
FIG. 6 shows a push-pull amplifier circuit according to a fifth exemplary embodiment of the present invention.
Figure 7:
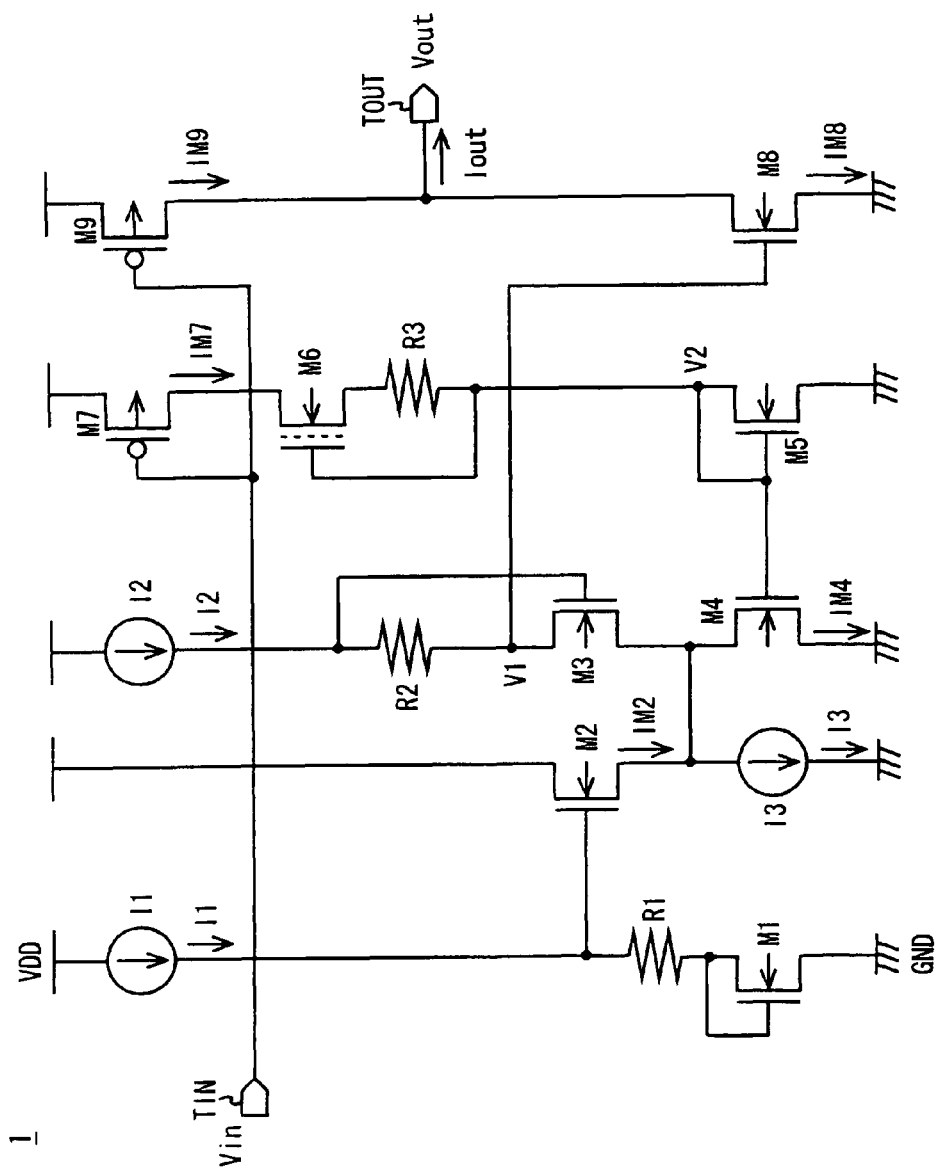
FIG. 7 shows a push-pull amplifier circuit according to the prior art.

A fifth exemplary embodiment of the present invention will be described in detail below with reference to the drawings. FIG. 6 shows a configuration of a push-pull amplifier circuit 600 according to the fifth exemplary embodiment. As shown in FIG. 6, the push-pull amplifier circuit 600 includes the constant current source I102, a constant current source I601, the PMOS transistors MP101 and MP104, the NMOS transistors MN101 and MN102, NMOS transistors MN601 and MN602, the resistor R101, the signal input terminal TIN, and the signal output terminal TOUT. Note that reference symbols in FIG. 6 that are identical to those in FIG. 1 denote identical or similar components. The fifth exemplary embodiment differs from the first exemplary embodiment in that the constant current source I101 and the PMOS transistors MP102 and MP103 are omitted and the constant current source I601 and the NMOS transistors MN601 and MN602 are added. Therefore, in the fifth exemplary embodiment, only the difference is mainly described and the description of the other identical components is omitted.

The NMOS transistor MN601 has a drain and a gate both connected to the node N101, and a source connected to the ground voltage terminal GND. The NMOS transistor MN602 has a drain connected to the node N104, a source connected to the ground voltage terminal GND, and a gate connected to the node N101.

The constant current source I601 is connected between the power supply voltage terminal VDD and the node N102. Reference symbol "I601" denotes a current output from the constant current source I601 to the node N102 as well as the current value thereof. The drain currents of the NMOS transistors MN601 and MN602 are respectively represented by IMN601 and IMN602.

The operation of the push-pull amplifier circuit 600 will be qualitatively described. First, consider a case that the input voltage Vin supplied to the signal input terminal TIN decreases. When the input voltage Vin decreases, the drain currents IMP101 and IMP104 of the PMOS transistors MP101 and MP104 increase. The NMOS transistors MN601 and MN602 constitute a current mirror. Thus, when the drain current IMN101 increases, the drain current IMN602 of the NMOS transistor MN602 tends to increase.

However, the NMOS transistor MN602 is connected in parallel with the constant current source I102, and this parallel configuration is connected in series with the constant current source I601 in the same current path. Thus, when the drain current IMN602 tends to increase, the voltages at the nodes N102 to N104, which are located between the constant current source I601 and the parallel configuration, decrease. Meanwhile, when the voltage V104 of the node N104 decreases, the drain-source voltage of the NMOS transistor MN602 decreases and the drain current IMN602 tends to decrease. Accordingly, the voltages at the nodes N102 to N104 decrease to a level at which the increase and decrease of the drain current IMN602 are balanced.

As a result, the voltages V102 to V104 at the nodes N102 to N104 decrease. Then, the drain current IMN102 of the NMOS transistor MN102 having a gate connected to the node N103 decreases, and the output voltage Vout of the signal output terminal TOUT increases.

Next, consider a case that the input voltage Vin supplied to the signal input terminal TIN increases. When the input voltage Vin increases, the drain currents IMP101 and IMP104 of the PMOS transistors MP101 and MP104 decrease. Because the NMOS transistors MN601 and MN602 constitute a current mirror, when the drain current IMN101 decreases, also the drain current IMN602 of the NMOS transistor MN602 tends to decrease.

However, the NMOS transistor MN602 is connected in parallel with the constant current source I102, and this parallel configuration is connected in series with the constant current source I601 in the same current path. Thus, when the drain current IMN602 tends to decrease, the voltages at the nodes N102 to N104, which are located between the constant current source I601 and the parallel configuration, increase. Meanwhile, when the voltage V104 of the node N104 increases, the drain-source voltage of the NMOS transistor MN602 increases and the drain current IMN602 tends to increase. Accordingly, the voltages at the nodes N102 to N104 increase to a level at which the increase and decrease of the drain current IMN602 are balanced. In this way, the push-pull amplifier circuit 600 operates push-pull output function on the PMOS transistor MP104 and the NMOS transistor MN102 which are provided at the output stage.

Further, the operation of the push-pull amplifier circuit 600 will be quantitatively described. In the push-pull amplifier circuit 600, (W/L)MP102 and (W/L)MP103 shown in the expression (1) are replaced by (W/L)MN601 and (W/L)MN602, respectively. Note that (W/L)MN601 and (W/L)MN602 represent gate W/L ratios of the NMOS transistors MN601 and MN602, respectively. Thus, the following expression (20) is satisfied in place of the expression (7).

$$V104 = V102 - V103 = R101 \times (IMN602 + I102) \quad (20)$$

Furthermore, the following expression (21) is satisfied in place of the expression (9).

$$I601 = q \times IMP101 + I102 \quad (21)$$

From the expressions (6) and (21), the drain current IMN102 can be expressed as the following expression (22).

$$IMN102 = r \times IMN101 = r \times I601 = r \times (q \times IMP101 + I102) \quad (22)$$

Assume that the drain current IMP101 of the PMOS transistor MP101 is "I0" when the output current Iout from the signal output terminal TOUT is zero, i.e., when the circuit is in the stand-by state. If IMP101=I0, it is obvious that IMN102=IMP104. Thus, the expression (23) is obtained, and the expression (24) is further obtained.

$$IMN102 = r \times (q \times I0 + I102) = p \times I0 = IMP104 \quad (23)$$

$$I102 = \left(\frac{p}{r} - q\right) \times I0 \quad (24)$$

When the expression (24) is substituted into the expression (21), the following expression (25) is obtained.

$$I601 = q \times I0 + \left(\frac{p}{r} - q\right) \times I0 = \frac{p}{r} \times I0 \quad (25)$$

In view of the foregoing, the expressions (20), (24), and (25) are conditions that define the voltage V104, the resistance value of the resistor R101, and the current values output from the constant current sources I102 and I601, during the circuit design. As seen from the expression (24), if p/r=q, I102=0. This eliminates the need for the constant current source I102, and thus the constant current source I102 can be omitted from the push-pull amplifier circuit 600. Consequently, the push-pull amplifier circuit can be formed with a small number of circuit elements.

Further, as with the push-pull amplifier circuit 200 of the second exemplary embodiment, the push-pull amplifier circuit 600 may have a configuration in which the differential amplifier circuit 210 is connected as the pre-stage circuit. When the differential amplifier circuit 210 is connected as the pre-stage circuit, an operational amplifier circuit (Op Amp) can be constituted.

Furthermore, as with the push-pull amplifier circuit 300 of the third exemplary embodiment, the push-pull amplifier circuit 600 may include a capacitor element for phase compensation. This configuration prevents the occurrence of oscillation due to a phase delay, as with the push-pull amplifier circuit 400, even if an operational amplifier circuit (Op Amp) is formed to apply negative feedback.

Moreover, as with the push-pull amplifier circuit 500 of the fourth exemplary embodiment, the constant current source I102 of the push-pull amplifier circuit 600 may be composed of a transistor, a resistor, and the like. In this case, the current mirror composed of the MNOS transistors MN601 and MN602 of the push-pull amplifier circuit 600 may also be implemented with the NMOS transistors MN501, MN502, and MN504 and the resistor R501. Also in this case, the condition for the circuit design as shown in the expression (19) is applicable.

Note that the present invention is not limited to the above exemplary embodiments and can be modified in various manners without departing from the scope of the present invention. Circuits that operate in the same manner as in the exemplary embodiments can be obtained also in the following case. That is, in the circuits according to the exemplary embodiments, all of the NMOS transistors may be replaced by PMOS transistors and all of the PMOS transistors may be replaced by NMOS transistors. Further, the direction of the current from the constant current source may be inverted. Furthermore, the power supply voltage VDD may be replaced by the ground voltage GND and the ground voltage GND may be replaced by the power supply voltage VDD.

Alternatively, the MOS transistors provided in the circuits according to the exemplary embodiments may be replaced by bipolar transistors.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to fifth exemplary embodiments can be combined as desirable by one of ordinary skill in the art.

What is claimed is:

1. A push-pull amplifier circuit comprising first, second, and third current paths,
    wherein the first current path includes a first transistor that allows a first current to flow through the first current path according to an input signal,
    wherein the second current path includes:
        a second transistor that allows a second current to flow through the second current path according to the first current, the second current having a phase opposite to a phase of the first current;
        a first resistor; and
        a third transistor that has a control terminal directly connected to the first resistor, and
    wherein the third current path includes:
        an output terminal;
        a fourth transistor that is connected to the output terminal and allows a current to flow through the third current path according to the input signal, the current having a same phase as the first current; and
        a fifth transistor that is connected to the output terminal and allows a current to flow through the third current path according to a voltage of a first node between the first resistor and the third transistor, the current having the same phase as the second current.

2. The push-pull amplifier circuit according to claim 1, further comprising a constant current source connected between the third transistor and a ground voltage terminal.

3. A push-pull amplifier circuit comprising:
    first, second, and third current paths; and
    at least one of a first, second, and third capacitor elements,
    wherein the first current path includes a first transistor that allows a first current to flow through the first current path according to an input signal,
    wherein the second current path includes:
        a second transistor that allows a second current to flow through the second current path according to the first current, the second current having a phase opposite to a phase of the first current:
        a first resistor; and
        a third transistor that is connected to one end of the first resistor and has a control terminal connected to an other end of the first resistor,
    wherein the third current path includes:
        an output terminal;
        a fourth transistor that is connected to the output terminal and allows a current to flow through the third current path according to the input signal, the current having a same phase as the first current; and
        a fifth transistor that connected to the output terminal and allows a current to flow through the third current path according to a voltage of a first node between the first resistor and the third transistor, the current having the same phase as the second current,
    wherein the first capacitor element is connected between an input terminal and the output terminal, the input terminal receiving the input signal,
    wherein the second capacitor element is connected between the first node and the output terminal, and
    wherein the third capacitor element is connected in parallel with the first resistor.

4. A push-pull amplifier circuit comprising:
    first, second, and third current paths,
    wherein the first current path is connected between a first power supply terminal and a second power supply terminal, and the first current path includes:
        a first transistor that allows a first current to flow through the first current path according to an input signal;
        a sixth transistor; and
        a first constant current source,
    wherein the second current path includes:
        a second transistor that allows a second current to flow through the second current path according to the first current, the second current having a phase opposite to a phase of the first current;
        a first resistor; and
        a third transistor that is connected to one end of the first resistor and has a control terminal connected to an other end of the first resistor, wherein the third current path includes:
an output terminal;
a fourth transistor that is connected to the output terminal and allows a current to flow through the third current path according to the input signal, the current having a same phase as the first current; and
a fifth transistor that is connected to the output terminal and allows a current to flow through the third current path according to a voltage of a first node between the first resistor and the third transistor, the current having the same phase as the second current,
wherein the first and sixth transistors are connected in parallel between the first power supply terminal and a second node,
wherein control terminals of the second and sixth transistors are each connected to the second node, and
wherein the first constant current source is connected between the second node and the second power supply terminal.

5. The push-pull amplifier circuit according to claim 4, wherein the second current path is connected between the first power supply terminal and the second power supply terminal, and further includes a second constant current source,
wherein the second transistor is connected between the first power supply terminal and a third node, and has a control terminal connected to the second node,
wherein the other end of the first resistor is connected to the third node, and
wherein the second constant current source is connected between the second power supply terminal and the third transistor.

6. The push-pull amplifier circuit according to claim 5, wherein a value of a voltage drop at both ends of the first resistor is substantially equal to a value of a voltage difference between both ends of the second constant current source when the second constant current source allows the second current to flow.

7. The push-pull amplifier circuit according to claim 5, further comprising a bias voltage generation circuit that includes a second resistor and a seventh transistor, the second resistor and the seventh resistor being connected in series between the first and second power supply terminals,
wherein the seventh transistor has a control terminal connected to a fourth node between the second resistor and the seventh transistor, and
wherein current values output from the first and second constant current sources are determined according to a voltage of the fourth node.

8. The push-pull amplifier circuit according to claim 7, wherein the first and second constant current sources include eighth and ninth transistors, respectively, and
wherein control terminals of the eighth and ninth transistors are each connected to the fourth node.

9. The push-pull amplifier circuit according to claim 5, further comprising a bias voltage generation circuit that comprises:
a second resistor;
a third resistor;
a seventh transistor; and
a tenth transistor, the second and third resistors and the seventh and tenth transistors being connected in series between the first and second power supply terminals,
wherein the third resistor is connected between the first power supply terminal and a fifth node,
wherein the second resistor is connected between the fifth node and a fourth node,
wherein the tenth transistor is connected between the fourth node and a sixth node,
wherein the seventh transistor is connected between the sixth node and the second power supply terminal,
wherein the tenth transistor has a control terminal connected to the fifth node,
wherein the seventh transistor has a control terminal connected to the fourth node, and
wherein current values output from the first and second constant current sources are determined according to a voltage of the fourth node.

10. The push-pull amplifier circuit according to claim 9, wherein the first constant current source includes an eighth transistor,
wherein the second constant current source includes a ninth transistor, and
wherein control terminals of the eighth and ninth transistors are each connected to the fourth node.

11. The push-pull amplifier circuit according to claim 10, wherein a resistance ratio between the second resistor and the first resistor is substantially equal to a transistor size ratio between the ninth transistor and the seventh transistor.

12. A push-pull amplifier circuit comprising first, second, and third current paths that are connected between a first power supply terminal and a second power supply terminal,
wherein the first current path includes:
a first transistor that allows a first current to flow through the first current path according to an input signal; and
an eleventh transistor connected in series with the first transistor,
wherein the second current path includes:
a second transistor that allows a second current to flow through the second current path according to the first current, the second current having a phase opposite to a phase of the first current;
a first resistor; and
a third transistor that is connected to one end of the first resistor and has a control terminal connected to an other end of the first resistor; and
first and second constant current sources connected in series with the first resistor and the third transistor, and the second transistor connected in parallel with the second constant current source,
wherein the third current path includes:
an output terminal;
a fourth transistor that is connected to the output terminal and allows a current to flow through the third current path according to the input signal, the current having a same phase as the first current; and
a fifth transistor that is connected to the output terminal and allows a current to flow through the third current path according to a voltage of a first node between the first resistor and the third transistor, the current having the same phase as the second current,
wherein the eleventh transistor has a control terminal connected to a seventh node between the first transistor and the eleventh transistor,
wherein the first constant current source is connected between the first power supply terminal and the other end of the first resistor,
wherein the second constant current source is connected between the third transistor and the second power supply terminal, and
wherein the second transistor has a control terminal connected to the seventh node.

13. The push-pull amplifier circuit according to claim 12, further comprising a bias voltage generation circuit that includes a second resistor and a seventh transistor, the second resistor and the seventh transistor being connected in series between the first and second power supply terminals,
   wherein the seventh transistor has a control terminal connected to a fourth node between the second resistor and the seventh transistor, and
   wherein a current value output from the second constant current source is determined according to a voltage of the fourth node.

14. The push-pull amplifier circuit according to claim 13, wherein the second constant current source includes a ninth transistor, and
   wherein the ninth transistor has a control terminal connected to the fourth node.

15. The push-pull amplifier circuit according to claim 12, further comprising a bias voltage generation circuit that includes second and third resistors and seventh and tenth transistors, the second and third resistors and the seventh and tenth transistors being connected in series between the first and second power supply terminals,
   wherein the third resistor is connected between the first power supply terminal and a fifth node,
   wherein the second resistor is connected between the fifth node and a fourth node,
   wherein the tenth transistor is connected between the fourth node and a sixth node,
   wherein the seventh transistor is connected between the sixth node and the second power supply terminal,
   wherein the tenth transistor has a control terminal connected to the fifth node,
   wherein the seventh transistor has a control terminal connected to the fourth node, and
   wherein a current value output from the second constant current source is determined according to a voltage of the fourth node.

16. The push-pull amplifier circuit according to claim 15, wherein the second constant current source includes a ninth transistor, and
   wherein the ninth transistor has a control terminal connected to the fourth node.

17. The push-pull amplifier circuit according to claim 16, wherein a resistance ratio between the second resistor and the first resistor is substantially equal to a transistor size ratio between the ninth transistor and the seventh transistor.

18. A push-pull amplifier circuit comprising first, second, and third current paths,
   wherein the first current path includes a first transistor that allows a first current to flow through the first current path according to an input signal,
   wherein the second current path includes:
      a second transistor that allows a second current to flow through the second current path according to the first current, the second current having a phase opposite to a phase of the first current;
      a first resistor; and
      a third transistor that is connected to one end of the first resistor and has a control terminal connected to an other end of the first resistor,
   wherein the third current path includes:
      an output terminal;
      a fourth transistor that is connected to the output terminal and allows a current to flow through the third current path according to the input signal, the current having a same phase as the first current; and
      a fifth transistor that is connected to the output terminal and allows a current to flow through the third current path according to a voltage of a first node between the first resistor and the third transistor, the current having the same phase as the second current, and
   wherein an operational amplifier circuit is formed by connecting an output terminal of a differential amplifier circuit that outputs an output signal according to a differential input signal, with an input terminal that receives the input signal of the push-pull amplifier circuit.

19. An operational amplifier circuit comprising:
   a push-pull amplifier circuit comprising first, second, and third current paths; and
   a differential amplifier circuit that outputs an output signal according to a differential input signal,
   wherein the first current path includes a first transistor that allows a first current to flow through the first current path according to an input signal,
   wherein the second current path includes:
      a second transistor that allows a second current to flow through the second current path according to the first current, the second current having a phase opposite to a phase of the first current;
      a first resistor; and
      a third transistor that is connected to one end of the first resistor and has a control terminal connected to an other end of the first resistor,
   wherein the third current path includes:
      an output terminal;
      a fourth transistor that is connected to the output terminal and allows a current to flow through the third current path according to the input signal, the current having a same phase as the first current; and
      a fifth transistor that is connected to the output terminal and allows a current to flow through the third current path according to a voltage of a first node between the first resistor and the third transistor, the current having the same phase as the second current, and
   wherein an input terminal that receives the input signal of the push-pull amplifier circuit is connected with an output terminal of the differential amplifier circuit.

* * * * *